United States Patent
Cical et al.

(10) Patent No.: US 9,184,623 B1
(45) Date of Patent: Nov. 10, 2015

(54) CIRCUITS FOR AND METHODS OF IMPLEMENTING A CHARGE/DISCHARGE SWITCH IN AN INTEGRATED CIRCUIT

(71) Applicant: Xilinx, Inc., San Jose, CA (US)

(72) Inventors: Ionut C. Cical, Saggart (IE); John K. Jennings, Glenageary (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/694,862

(22) Filed: Apr. 23, 2015

(51) Int. Cl.
| | |
|---|---|
| H03L 7/06 | (2006.01) |
| H02J 7/34 | (2006.01) |
| H02J 7/00 | (2006.01) |
| H03K 17/56 | (2006.01) |

(52) U.S. Cl.
CPC .............. H02J 7/34 (2013.01); H02J 7/0072 (2013.01); H03K 17/56 (2013.01); *H02J 7/345* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,154,162 | A * | 11/2000 | Watson et al. ................ | 341/150 |
| 7,102,557 | B1 * | 9/2006 | Frith ............................ | 341/150 |
| 8,970,639 | B2 * | 3/2015 | Tu ............................... | 345/690 |
| 2008/0024456 | A1 * | 1/2008 | Peng et al. ................... | 345/173 |
| 2008/0088594 | A1 * | 4/2008 | Liu et al. ..................... | 345/173 |
| 2009/0231003 | A1 * | 9/2009 | Chen et al. ................... | 327/157 |
| 2009/0261999 | A1 * | 10/2009 | Ramaswami et al. ........ | 341/120 |
| 2010/0200734 | A1 * | 8/2010 | Uo ............................. | 250/214 R |
| 2014/0119077 | A1 * | 5/2014 | Walters et al. ................ | 363/89 |
| 2014/0245051 | A1 * | 8/2014 | Itabashi et al. .............. | 713/324 |
| 2015/0066438 | A1 * | 3/2015 | Brooks et al. ............... | 702/191 |
| 2015/0194949 | A1 * | 7/2015 | McQuirk et al. ............. | 327/291 |

* cited by examiner

*Primary Examiner* — Adam Houston
(74) *Attorney, Agent, or Firm* — John J. King (57) ABSTRACT

A circuit for implementing a charge/discharge switch in an integrated circuit is described. The circuit comprises a supply bias path coupled to a first node, wherein the supply bias path provides a charging bias current to the first node; a charge transistor connected between the first node and a first terminal of a capacitor; a charge switch coupled between the first node and a ground potential, wherein the charge switch enables charging of the capacitor by way of the first node; a discharge transistor connected between the first terminal of the capacitor and a second node; a discharge switch coupled between the second node and a reference voltage, wherein the discharge switch enables discharging of the capacitor by way of the second node; and a ground bias path coupled between the second node and ground, wherein the ground bias path provides a discharging bias current to the second node. A method of implementing a charge/discharge switch in an integrated circuit is also described.

20 Claims, 6 Drawing Sheets

CIRCUITS FOR AND METHODS OF IMPLEMENTING A CHARGE/DISCHARGE SWITCH IN AN INTEGRATED CIRCUIT

FIELD OF THE INVENTION

The present invention relates generally to integrated circuit devices, and in particular, to circuits for and methods of implementing a charge/discharge switch in an integrated circuit device.

BACKGROUND OF THE INVENTION

Capacitors are important elements in many electronic devices, including integrated circuit devices. Many applications of the capacitors require that a capacitor is charged and discharged. However, the charging and discharging can lead to problems in the circuit. Conventional circuits for enabling the charging and discharging of a capacitor rely on sink/source devices, such as bias transistors, to control the amount of current flowing to or from the capacitor. The switch is controlled digitally by charge and discharge signals that dictate the flow of the current.

Conventional circuits have used charge and discharge paths to charge and discharge a capacitor including a bias device to dictate the current magnitude, a cascode device to give good power supply rejection and gain, and a switch to perform the switching. Because the bias device is turned off and on by the switching of this scheme, a large glitch occurs on the transition. Some conventional circuits have added matching dummy paths in parallel to the charge and discharge paths to shunt the current during the "off" phase without changing the state of the bias device, thereby reducing the glitch. However, there may still be charge injection associated with the parasitic capacitance of the switches into a node at a terminal of the capacitor when switching from a charge mode to a discharge mode or vice-versa. The charge injection depends on the size of the switch, which in turn dictates the amount of glitch induced in the node at the terminal of the capacitor. While making these switch devices small will reduce the size of the glitch, such a reduction is made at a cost of headroom for the bias and cascode devices because the switch resistance increases and thus they require more IR drop in the system. As transistor sizes continue to be reduced and voltage supply levels continue to drop, cascode devices are becoming more difficult to implement because of the reduced headroom.

According, improved circuits for and methods of implementing a charge/discharge switch in an integrated circuit is beneficial.

SUMMARY OF THE INVENTION

A circuit for implementing a charge/discharge switch in an integrated circuit is described. The circuit comprises a supply bias path coupled to a first node, wherein the supply bias path provides a charging bias current to the first node; a charge transistor connected between the first node and a first terminal of a capacitor; a charge switch coupled between the first node and a ground potential, wherein the charge switch enables charging of the capacitor by way of the first node; a discharge transistor connected between the first terminal of the capacitor and a second node; a discharge switch coupled between the second node and a reference voltage, wherein the discharge switch enables discharging of the capacitor by way of the second node; and a ground bias path coupled between the second node and ground, wherein the ground bias path provides a discharging current to the second node.

According to another implementation, a circuit for implementing a charge/discharge switch in an integrated circuit comprises a capacitor; a charging circuit comprising: a supply bias path coupled to a first node, wherein the supply bias path provides a charging bias current to the first node; a charge transistor connected between the first node and a first terminal of a capacitor; a charge switch coupled between the first node and a ground potential; and a discharging circuit comprising: a discharge transistor connected between the first terminal of the capacitor and a second node; a discharge switch coupled between the second node and a reference voltage, wherein the discharge switch enables discharging of the capacitor by way of the second node; and a ground bias path coupled between the second node and ground, wherein the ground bias path provides a discharging bias current to the second node; wherein the charging circuit and the discharging circuit enable implementing the circuit in a charge mode and a discharge mode, and a discharge path through a transistor is turned on before a charge path through the charge transistor is turned off.

A method of implementing a charge/discharge switch in an integrated circuit is also described. The method comprises providing a charging path for charging a capacitor; providing a charge switch, separate from the charging path, to enable charging the capacitor by way of the charging path; providing a discharging path for discharging the capacitor; and providing a discharge switch, separate from the discharge path, to enable discharging the capacitor by way of the discharging path.

Other features will be recognized from consideration of the Detailed Description of the Drawings and the Claims, which follow.

DETAILED DESCRIPTION OF THE DRAWINGS

Circuit for and methods of implementing a charge/discharge switch in an integrated circuit are described. The charge/discharge switches are implemented within circuits having one or more capacitors which may be charged and discharged, such as a loop filter of a phase-locked loop (PLL), a current output digital-to-analog circuit (DAC), or a relaxation oscillator, for example. The circuits and methods remove the inherent glitch induced in the sample node of the capacitor during switching between charge and to discharge modes, and improve analog performance.

More particularly, in order to reduce the glitching at node of a capacitor and ensuring adequate headroom, the switches have been removed from the main current path in the charging path, and only appear in the dummy path of the charge/discharge circuit. By removing the switching devices from the main current path, it is possible to ensure that no extra headroom constraint is required for the bias devices and moves the charge injection effect away from the node of the capacitor. Accordingly, all the switching takes place on the dummy side associated with charging or discharging and, as a consequence, glitch is removed one transistor further from the sensitive node of the capacitor. The switch can therefore be driven with full swing signals that allows for smaller sizing of transistors and thus less charge injection. That is, once the dummy switch turns on, the dummy path provides a lower resistance path for the current, thus effecting switching and the dummy cascode of the charging or discharging path always be on to the maximum extent. The advantage of this approach is that the headroom of the system is independent of the switches and the glitch induced in the system is moved away from the node of the capacitor. Further, by implementing one transistor that not only performs the cascode function when the current is flowing, but also performs the switching function when disabling the current path, voltage headroom is saved and the quality of the switch is improved.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
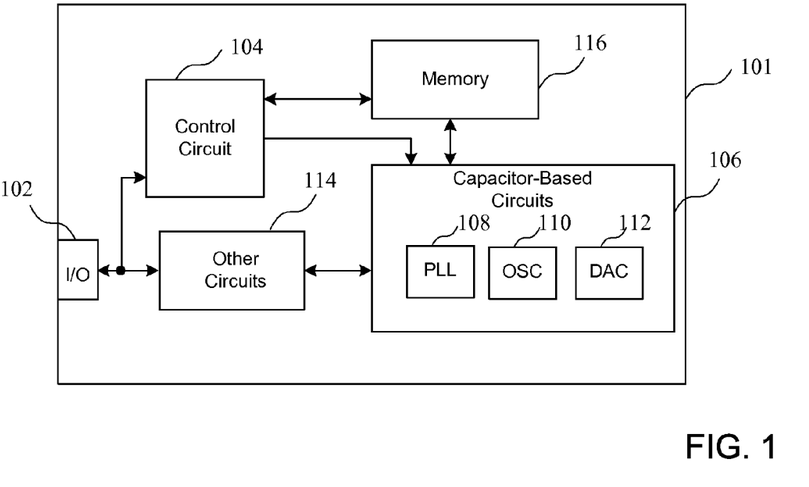
FIG. 1 is a block diagram of an integrated circuit having capacitor-based circuits.

Turning first to FIG. 1, a block diagram of an integrated circuit 101 having capacitor-based circuits is shown. In particular, an input/output port 102 is coupled to a control circuit 104 that interfaces with the capacitor-based circuits 106, which may include a phase-locked loop circuit 108, a relaxation oscillator 110, and a current output DAC circuit 112, for example. Circuits and methods for implementing a charge/discharge switch are described in more detail in reference to FIG. 2, and applications of the charge/discharge switch in phase-locked loop circuit 108, the relaxation oscillator 110, and the current output DAC circuit 112 are described in more detail in reference to FIGS. 8-10. The control circuit 104 may also be coupled to other circuits 114 and a memory 116. The circuits and methods set forth in more detail below may be implemented within a single integrated circuit die, or may be implemented in a multi-chip module.

Figure 2:
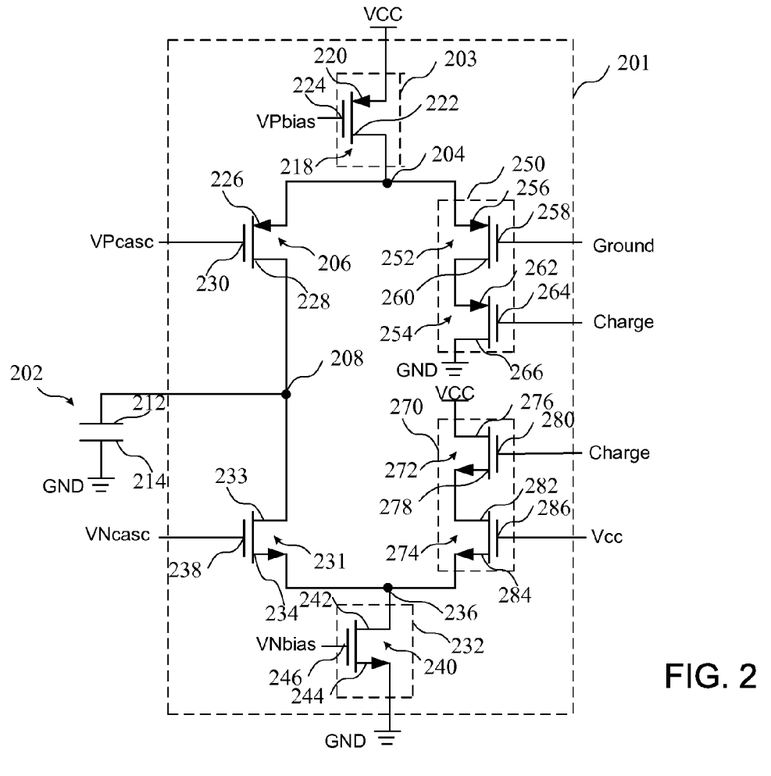
FIG. 2 is a block diagram of a circuit for implementing a charge/discharge switch in an integrated circuit.

Turning now to FIG. 2, a block diagram of a circuit for implementing a charge/discharge switch in an integrated circuit is shown. A circuit 201 for implementing a charge/discharge switch is coupled to a capacitor 202 and enables the charging and discharging of the capacitor. As described in more detail below, the switching operation between charge and discharge modes of the circuit 201 is enabled without switching transistors in the charging or discharging paths of the circuit, but rather by implementing switching transistors that enable the switching between charging and discharging modes in a dummy path. While the dummy paths ensure that bias current is always flowing and keep the nodes of the bias devices constant to minimize glitches, the switching is also advantageously controlled by the operation of the dummy paths.

A supply bias path 203 is coupled to a node 204, and enables the supply of current to the capacitor 202 by way of a transistor 206, which is coupled between the node 204 and a node 208, during the charging mode. That is, transistors used for switching between charging and discharging modes are located in dummy paths separate from the charging and the discharging paths. The implementation of a charge/discharge switch may be achieved by implementing a supply bias path coupled to a first node, wherein the supply bias path provides a charging bias current to the first node; a charge transistor connected between the first node and a first terminal of a capacitor; and a charge switch coupled between the first node and a ground potential, wherein the charge switch enables charging of the capacitor by way of the first node. For a discharge mode, the implementation of the charge/discharge switch may be achieved by implementing a discharge transistor connected between the first terminal of the capacitor and a second node; a discharge switch coupled between the second node and a reference voltage, wherein the discharge switch enables discharging of the capacitor by way of the second node; and a ground bias path coupled between the second node and ground, wherein the ground bias path provides a discharging bias current to the second node. The capacitor 202 is coupled between the node 208 and a ground (GND) potential, where a first terminal 212 of the capacitor 202 is coupled to the node 208 and a second terminal 214 is coupled to ground. The transistor 206 and the supply bias path 203 are a part of a charging path for charging the capacitor during the charging mode.

The supply bias path 203 comprises P-channel transistor 218 having a source 220 coupled to a supply reference voltage, shown here as VCC, and a drain 222 coupled to the node 204, and provides a charging bias current to the capacitor. A supply bias voltage, VPbias, is coupled to gate 224. The supply bias voltage is generally a fixed value, and is used to drive current through either the charging path during the charging mode or a dummy path during the discharging mode as described in more detail below. The transistor 206 is a P-channel cascode transistor having a source 226 coupled to the node 204 and a drain 228 coupled to the node 208. A gate 230 is coupled to receive a control voltage VPcasc that is generally maintained on and allows current to charge the capacitor 202 during the charging mode, but draws little current during the discharge mode where current is driven to ground by way of a dummy discharge path. For example, driving the discharge mode, generally only leakage current will pass through transistor 206.

A discharge path for the capacitor 202 is also provided from the node 208 to ground by way of a transistor 231 comprising a cascode N-channel transistor and a ground bias path 232 that provides a discharging bias current to the second node. The transistor 231 comprises a drain 233 coupled to the node 208 and a source 234 coupled to a node 236 at the ground bias path 232. A gate 238 of the transistor 231 is controlled by a control voltage VNcasc. The ground bias path 232 comprises a transistor 240 having a drain 242 coupled to the node 236 and a source 246 coupled to ground. A ground bias voltage VNbias is coupled to a gate 246. The VNcasc signal is fixed value where the transistor 231 is also generally on, but may draw little current during a charging mode, during which current is driven through the ground bias path is provided by a discharging dummy path. The ground bias voltage, VNbias, is generally a fixed value, and is used to drive current through either the discharging path, or the discharging dummy path as described in more detail below.

In addition to the paths for charging and discharging the capacitor 202 as described, dummy paths are also provided to divert charge from the charging path during a discharging mode and to divert charge from the discharging path during a charging node. More particularly, during a discharging mode, current from the supply bias path 203 is diverted through a dummy charging path comprising a charge switch 250. The charge switch 250 comprises a first transistor 252 coupled in series with a second transistor 254, shown here as a P-channel transistors. As will be described in more detail below, the transistors 252 and 254 may be smaller (i.e. have a smaller gate width) than the cascode transistor 206 to reduce glitch at the node of the capacitor during switching. The transistor 206 not only operates as the cascode transistor, but also functions as the switch, where the voltage at the source of the transistor 206 is controlled by the charge switch 250 to enable or disable the charge path through the transistor 206. That is, the switch 250 controls the voltage at the source of the transistor 206 to turn the transistor 206 on or off. The first transistor 252 comprises a source 256 coupled to the node 204, where the gate 258 is coupled to receive the ground signal, and is therefore always on. While the transistor 252 is optional, the transistor 252 is advantageous because it enables a more efficient switching of the current through the charge switch 250. A drain 260 of the transistor 252 is coupled a source 262 of the transistor 254, where a charge signal at the gate 264 controls the transistor 254 and provides a path to the ground node (GND) by way the drain 266 of the transistor 254. When the transistors 252 and 254 of the switch 250 are on, the voltage at the first node 204 is pulled low to turn off the transistor 206 in the discharge mode. While implementing smaller transistors 252 and 254 compared to transistor 206 reduces the glitch on the capacitor, the smaller transistor have a reduced switching capability, where the transistor drive strength is determined by the size of the transistor multiplied by the square of the difference of gate-to-source voltage (Vgs) and the threshold voltage (Vt) of the transistor. However, a larger Vgs on the transistors 252 and 254 compensates for their smaller size and allows them to overpower the larger charging transistor 206 and pull the node 204 low during discharging.

Figure 3:
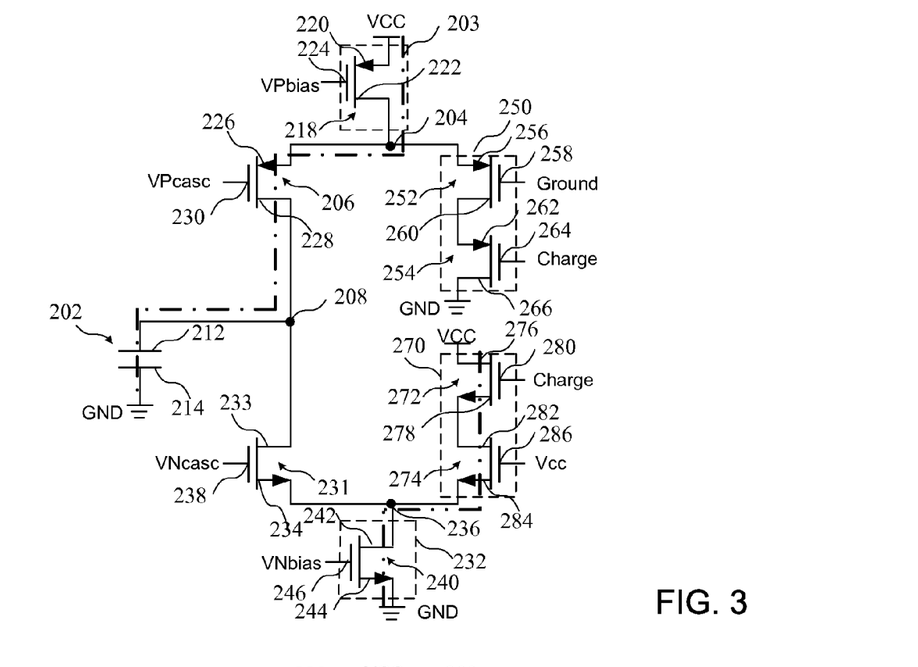
FIG. 3 shows a charging operation of the charge/discharge switch of FIG. 2.

During a charging mode as shown in FIG. 3, a high charge signal coupled to the gate of the transistor 254 will turn the transistor off, eliminating the path of current through the charge switch 250, and therefore drive the current provided by the source bias current path 203 through the transistor 206 to charge the capacitor 202 (as shown by the path designated with alternating dots and dashes). As can be seen in FIG. 3, the transistor that is used for enabling the charging of the capacitor 202 (switching on the current path to capacitor) is not provided in the path through which current flows to charge the capacitor. That is, transistor 254, which receives a high charge signal during a charging mode, disables the current path through the charge switch 250 and therefore enables the flow of current through the transistor 206 to charge the capacitor. Because the transistor 206 in the charging path is already on, any glitch at the node 208 as a result of turning on a transistor to enable the charging of the transistor is eliminated. That is, the transistor 254 (which is responsible for enabling charging of the capacitor) is a part of the charge switch 250 and is not in the charge path comprising the voltage bias path 203 and the transistor 206. Therefore, the node 208 is not affected by a glitch caused by changing between a charging mode and a discharging mode as a result of the switching of a transistor. Accordingly, rather than enabling the charging path to the node 208 by turning on a transistor in the charging path, the charging path is enabled by disabling a separate path to allow current to flow through the charging path.

In order to prevent the discharging of the capacitor by way of the transistors 231 and 240 during the charging mode, current drawn by the ground bias path 232 is provided by a dummy discharging path having the discharge switch 270. More particularly, a high charge signal (enabling the charging mode) will turn on transistor 272, and provide a path (shown with alternating dashes and double dots in FIG. 3) for the current to flow through the ground bias path 232 by way of a transistor 274. While the transistor 274 is optional, the transistor 274 is advantageous because it enables a more efficient switching of the current through the charge switch 270. That is, a drain of the transistor 272 is coupled to the reference voltage VCC, the source 278 is coupled to the transistor 274, and a gate 280 of the transistor is coupled to receive the charge signal. The source 270 of the transistor 272 is also coupled to a drain 282 of the transistor 274, which also has a source 284 that is coupled to the ground bias path 232 and has a gate 256 coupled to the reference voltage Vcc. Accordingly, current is not drawing from the capacitor 202 that would prevent the capacitor from charging during the charging mode. That is, the discharge switch 270 of the dummy path pulls the source 234 of the transistor 231 sufficiently high to turn off the transistor 231. Transistors 272 and 274 may be smaller (i.e. have a smaller gate width) than transistor 231 to reduce the glitch on the capacitor 202 during switching. Accordingly, the transistor 231 not only operates as a cascode transistor, but also operates as a switch, where the source 234 of the transistor 231 is controlled by the discharge switch 270 to enable or disable the discharging path through the transistor 231. That is, the discharge switch 270 enables the node 236 to be pulled high during to turn off transistor 231 during charging. It should also be noted that the switching of a transistor to prevent the discharge of the capacitor 202 during the charging mode (i.e. the switching of transistor 272) is also separate from the discharge path (i.e. the path having transistor 231 and transistor 240). Accordingly, any switching of a transistor 272 to prevent the discharging of capacitor during a charging mode will not cause any glitch on the node 208. A larger Vgs on the smaller transistors 272 and 274 compensates for their smaller size and allows them to overpower the larger discharging transistor 231 and pull the node 236 high during charging.

Figure 4:
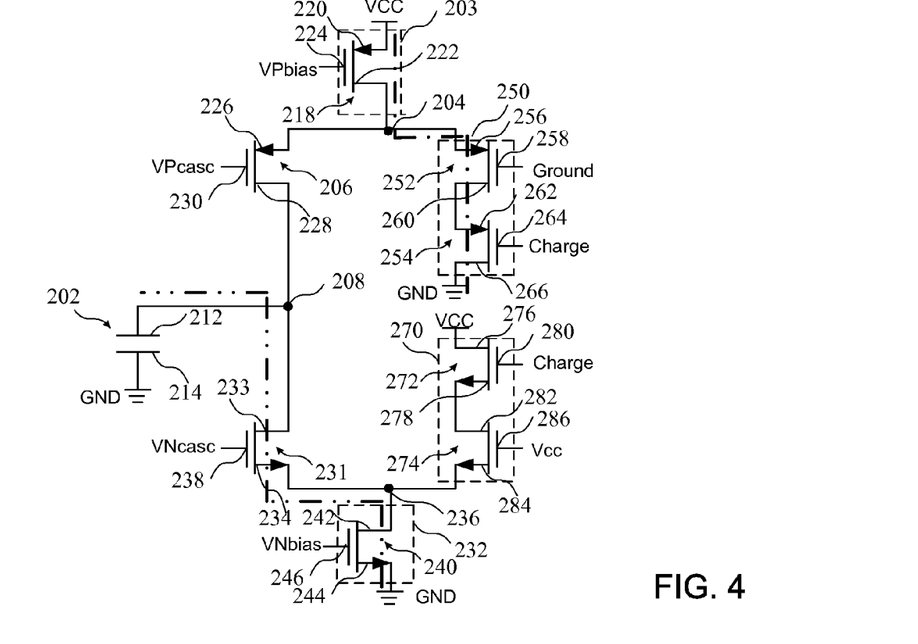
FIG. 4 shows a discharging operation of the charge/discharge switch of FIG. 2.

A discharging operation of the circuit for implementing a charge/discharge switch of FIG. 2 is shown in FIG. 4. During the discharging mode, the ground signal is low, turning on transistor 254 and providing a path (as shown by the line having alternating dashes and dots) from the supply bias path 203 to ground by way of the charge switch 250. Accordingly, little current will flow through transistor 206 to charge the capacitor. The low charge signal also turns off the transistor 272, and enables the discharge path (shown by the line having the alternating dash and double dots) for the capacitor by way of the transistors 231 and 240. That is, the charge switch 250 pulls the source 226 of transistor 206 sufficiently low to turn off transistor 206. More particularly, because the transistors 252 and 254 are smaller than transistor 206, the voltage at node 204 will be pulled sufficiently low to turn off transistor 206 during discharging. As with the case for the charging mode, the transistor 272 that is switched to enable the current path through transistor 231 in the discharging mode is not in the current path, and therefore does not create a glitch on the node 208. Therefore, switches 250 and 270 implemented in dummy paths advantageously provide a current to minimize or eliminate a glitch during switching in a charge/discharge circuit for a capacitor, and enable controlling the switching operations of the charge/discharge switch in place of dedicated transistors in the charging and discharging paths.

Figure 5:
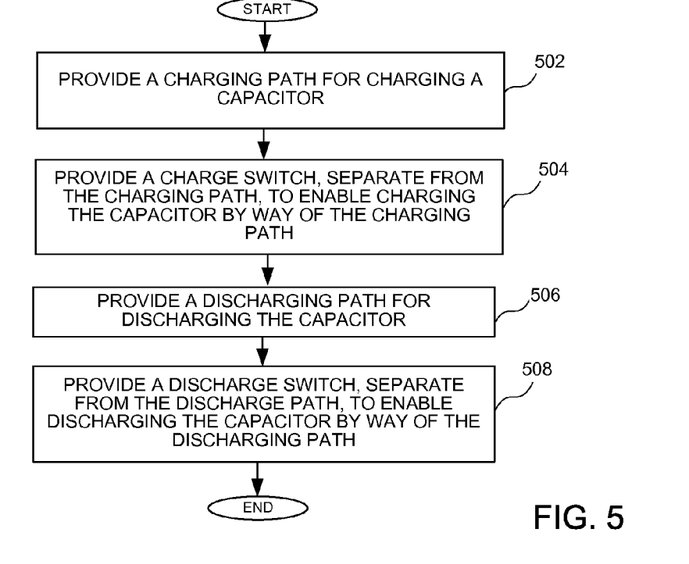
FIG. 5 is a flow chart showing a method of implementing a charge/discharge switch in an integrated circuit.

Turning now to FIG. 5, a flow chart shows a method of implementing a charge/discharge switch in an integrated circuit. In particular, a charging path for charging a capacitor is provided at a block 502. For example, the charge path could include transistor 218 and transistor 206. A charge switch, such as charge switch 250 that is separate from the charging path, is provided to enable charging the capacitor by way of the charging path at a block 504. A discharging path, which could include the transistor 240 and the transistor 231 for example, is provided for discharging the capacitor at a block 506. A discharge switch, such as the discharge switch 270 that is separate from the discharge path, is provided to enable discharging the capacitor by way of the discharging path at a block 508. The charge path and charge switch and the discharge path and discharge switch can be implemented as described in FIGS. 1-4. Further, the charge path and the charge switch can be implemented according to the blocks 602-606 of FIG. 6, and the discharge path and the discharge switch can be implemented according to the blocks 608-612.

Accordingly, glitch in the current is significantly reduced by removing a dedicated switching transistor from the main signal path used for charging and discharging. This is achieved by enabling a single transistor in both the charging and discharging path to operate as a cascode transistor when the current is switched to the main path as well as a switching transistor. That is, in addition to providing the cascode operation during the charging (for the transistor 206) or the discharging (for the transistor 231), the transistor behaves like an "off" switch when the current is switched to the dummy path by controlling the source of the transistor in the charging path. The configuration of the devices in the dummy path are, then, modified to focus on making the switching work in conjunction with the cascode device. The sizing and location of the switching device in the dummy path, being removed from the signal path, now result in a much reduced glitch in the signal path. Because there is now only two devices (e.g. a bias transistor and a cascode transistor) in the signal path compared to the three devices in conventional circuits, which include a switching transistor, the voltage headroom is now only required for two devices, and therefore improves accuracy.

Figure 6:
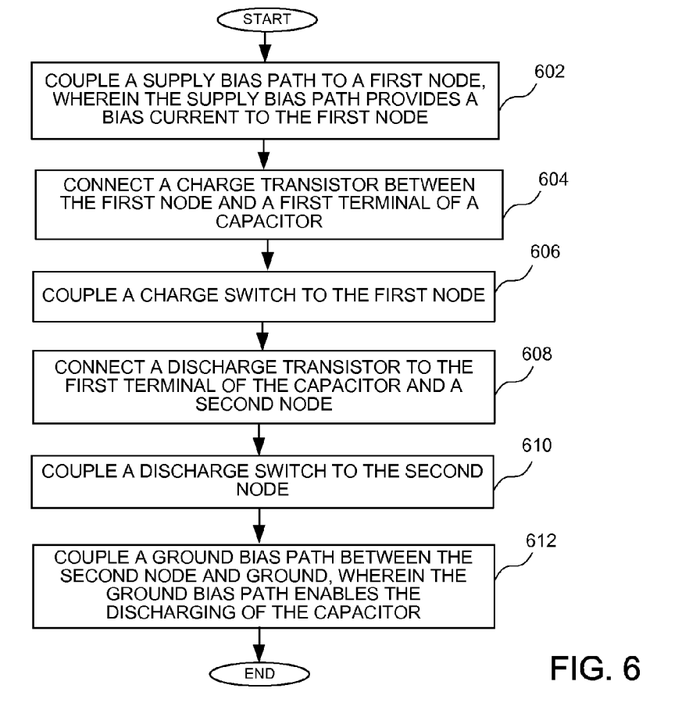
FIG. 6 is a flow chart showing another method of implementing a charge/discharge switch in an integrated circuit.

Turning now to FIG. 6, a flow chart shows another method of implementing a charge/discharge switch in an integrated circuit. In particular, a supply bias path is coupled to a first node, wherein the supply bias path provides a bias current to the first node at a block 602. A charge transistor is connected between the first node and a first terminal of a capacitor at a block 604. A charge switch is coupled to the first node at a block 606. Accordingly, any glitch at a node of the capacitor can be reduced by placing a switch that enables the charging of the capacitor in a separate path than a transistor that provides current to charge the capacitor.

A discharge transistor is connected to the first terminal of the capacitor and a second node at a block 608. A discharge switch is coupled to the second node at a block 610. A ground bias path is coupled between the second node and ground, wherein the ground bias path enables the discharging of the capacitor at a block 612. As with charging the capacitor, any glitch at a node of the capacitor can be reduced by placing a switch that enables the discharging of the capacitor in a separate path than a transistor that draws current to discharge the capacitor.

Figure 7:
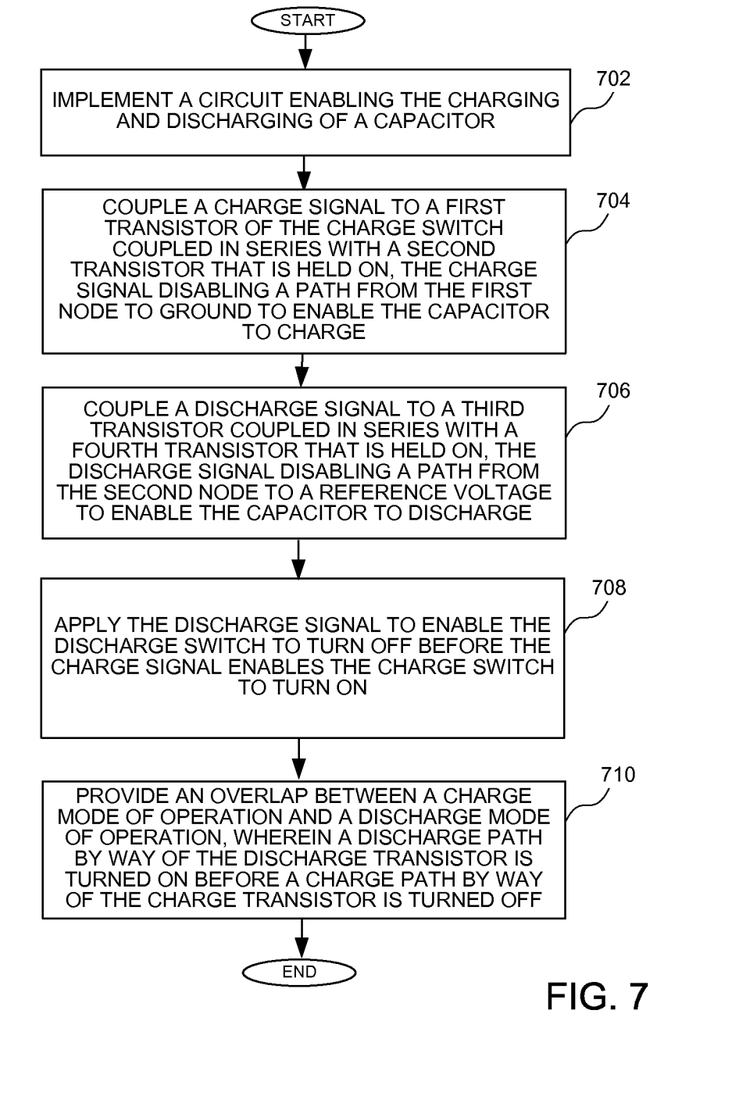
FIG. 7 is a flow chart showing a method of operating a charge/discharge switch in an integrated circuit.

Turning now to FIG. 7, a flow chart shows a method of operating a charge/discharge switch in an integrated circuit. A circuit enabling the charging and discharging of a capacitor is implemented at a block 702. A circuit for enabling the charging and the discharging of a capacitor can be implemented according to FIGS. 1 and 2, for example. A charge signal is coupled to a first transistor of the charge switch coupled in series with a second transistor, which is held on, the charge signal disabling a path from the first node to ground to enable the capacitor to charge at a block 704. A discharge signal is coupled to a third transistor coupled in series with a fourth transistor that is held on, the discharge signal disabling a path from the second node to a reference voltage to enable the capacitor to discharge at a block 706. For example, rather than applying the charge signal coupled to the charge switch to the discharge switch, a separate discharge signal, different than the charge signal, is coupled to the discharge switch, wherein discharge signal enables the discharge switch to turn off (i.e. to enable discharging of the capacitor by way of the discharge path) before the first control signal enables the charge switch to turn on (i.e. to enable charging of the capacitor to enable charging of the capacitor by way of the charging path) at a block 708. An overlap is provided between a charge mode of operation and a discharge mode of operation, wherein a discharge path by way of the discharge transistor is turned on before a charge path by way of the charge transistor is turned off at a block 710.

The various elements of the methods of FIGS. 5-7 may be implemented using the circuits of FIGS. 1-4 as described, or using some other suitable circuits. While specific elements of the methods are described, it should be understood that additional elements of the methods, or additional details related to the elements recited in FIGS. 5-7, could be implemented according to the disclosure of FIGS. 1-4 and 8-10.

Figure 8:
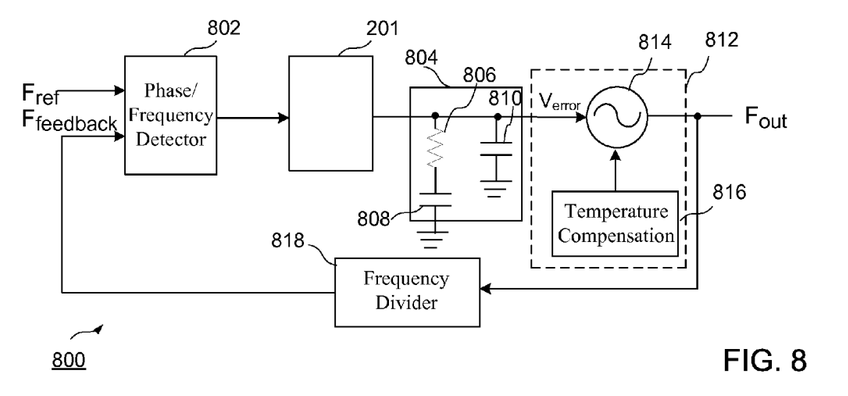
FIG. 8 is a block diagram of a phase-locked loop implementing a charge/discharge switch.

Turning now to FIG. 8, a block diagram of a phase-locked loop (PLL) 800 implementing a charge/discharge switch is shown. PLL 800 exemplifies a charge-pump based PLL, which is a PLL design implementation that facilitates flexible design tradeoffs by decoupling various design parameters, such as loop bandwidth, damping factor, and lock range. PLL 800 consists of a phase/frequency detector 802 that receives a reference signal $F_{ref}$ and a feedback signal $F_{feedback}$, and a loop filter 804 (having a parallel arrangement of a resistor 806 coupled in series with a capacitor 808 and capacitors 810) coupled to the resonator circuit 812 that generates an output signal $F_{out}$. The resonator circuit 812 includes an oscillator circuit 814 and a temperature compensation circuit 816, an output of which is coupled to a frequency divider 818. The circuit 201 enables the charging and discharging of the capacitor as described above by selectively applying a charging current to the capacitor and enabling discharging of the capacitor. By implementing the circuit 201 to enable charging and discharging the capacitor 808, improved performance can be achieved by the PLL.

Figure 9:
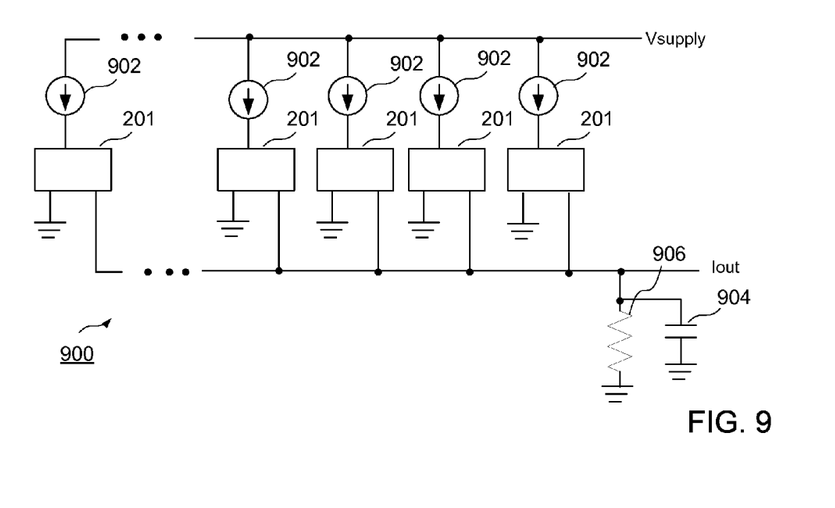
FIG. 9 is a block diagram of a current output digital-to-analog converter (DAC) implementing charge/discharge switches of FIG. 2.

Turning now to FIG. 9, a block diagram of a current output digital-to-analog converter (DAC) 900 implementing charge/discharge switches of FIG. 2 is shown. A plurality of current stages, each comprising a current source 902 coupled between a supply voltage (Vsupply) and a circuit 201, enable the switching the current sources 902 to adjust the $I_{out}$ current used to charge the capacitor 904 coupled in parallel with the resistor 906. By implementing the circuit 201 to enable charging and discharging the capacitor 906 to implement the current output DAC, improved performance of the DAC can be achieved.

Figure 10:
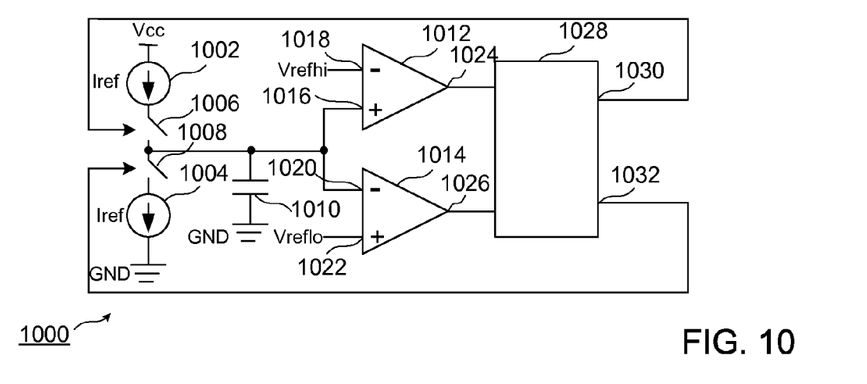
FIG. 10 is a block diagram of a relaxation oscillator implementing the charge/discharge switch of FIG. 2.

Turning now to FIG. 10, a block diagram of a relaxation oscillator 1000 implementing the charge/discharge switch of FIG. 2 is shown. In particular, the relaxation oscillator 1000 comprises a first current source 1002 and a second current source 1004, where the first current source 1002 is controlled by a first switch 1006 and the second current source 1004 is controlled by a second switch 1008. The first and second switches control the charging and discharging of a capacitor 1010, where current sources 1002 and 1004 and switches 1006 and 1008 could be implemented by the circuit 201 for implementing a charge/discharge switch coupled to a capacitor. A terminal of the capacitor is coupled to inputs of a first comparator 1012 and a second comparator 1014. More particularly, the capacitor 1010 is coupled to a positive input 1016 of the first comparator 1012, and a first reference voltage (Vrefhi) is coupled to a negative input 1018. The capacitor 1010 is also coupled to a negative input 1020 of the second comparator 1014, and a second reference voltage (Vreflo) is coupled to a positive input 1022. A first output 1024 and a second output 1026 is coupled to a logic circuit 1028 that latches the outputs of the comparators, where an output 1030 is coupled to control the first switch 1006 and an output 1032 is coupled to control the second switch 1008. That is, as the charge on the capacitor increases and is equal to the reference voltage Vrefhi, the signal generated at the output 1030 is used to open the switch 1006 to stop charging the capacitor and the signal generated at the output 1032 is used to close the switch 1008 to start the discharching. The switch 1008 could be closed first to start the discharging before the switch 1004 is opened, as set forth above. Similarly, when the charge on the capacitor decreases and is equal to the reference voltage Vreflo, a signal generated at the output 1030 is used to close the switch 1004 and the output 1032 is used to open the switch 1008 and enable charging the capacitor.

Figure 11:
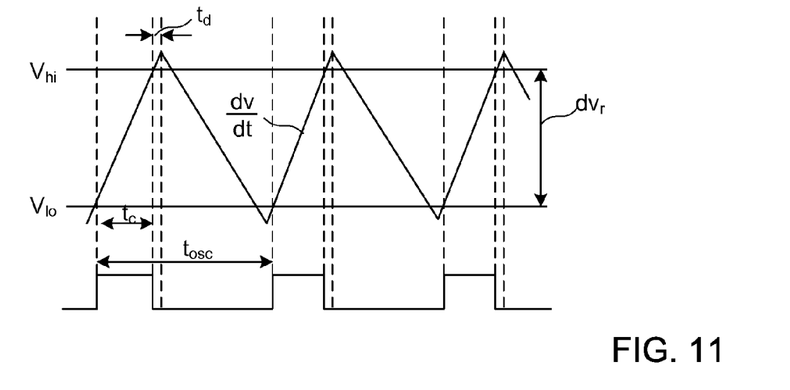
FIG. 11 is a timing diagram showing the operation of the relaxation oscillator of FIG. 10.

The relaxation oscillator is based upon the charging and discharging of the capacitor through a constant current source. As shown in the timing diagram of FIG. 1 associated with the circuit of FIG. 10, the current sources 1002 and 1004 are switched in and out to enable charging and discharging the capacitor 1010 to enable the logic circuit 1028 to generate the square wave at the output 1030, where:

$$t_{osc} = 2*t_c + 4*t_d;$$

$$tc = C*dV/Iref;$$

$$dV = Vrefhi - Vreflo; \text{ and}$$

$$t_d = t_{comparator} + t_{latch} + t_{switches}.$$

The operation of the relaxation operator is improved by eliminating any glitch caused by the switching of the transistors which enable charging and discharging the capacitor.

It can therefore be appreciated that new circuits for and methods of implementing a charge/discharge circuit in an integrated circuit has been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for implementing a charge/discharge switch in an integrated circuit, the circuit comprising:

a supply bias path coupled to a first node, wherein the supply bias path provides a charging bias current to the first node;

a charge transistor connected between the first node and a first terminal of a capacitor;

a charge switch coupled between the first node and a ground potential, wherein the charge switch enables charging of the capacitor by way of the first node;

a discharge transistor connected between the first terminal of the capacitor and a second node;

a discharge switch coupled between the second node and a reference voltage, wherein the discharge switch enables discharging of the capacitor by way of the second node; and a ground bias path coupled between the second node and ground, wherein the ground bias path provides a discharging bias current to the second node.

2. The circuit of claim 1 wherein the charge switch is provided in a current path that is separate from a charge path enabling charging of the capacitor.

3. The circuit of claim 1 wherein the charge switch comprises a first transistor coupled to receive a charge signal that disables a path from the first node to the ground potential and enables the capacitor to charge.

4. The circuit of claim 3 wherein the charge switch comprises a second transistor that is coupled in series with the first transistor and is held on.

5. The circuit of claim 1 wherein the discharge switch is provided in a current path that is separate from a path enabling discharging of the capacitor.

6. The circuit of claim 1 wherein the discharge switch comprises a first transistor coupled to receive the discharge signal to disable a path from the second node to a supply voltage and to enable the capacitor to discharge.

7. The circuit of claim 6 wherein the discharge switch comprises a second transistor that is coupled in series with the first transistor and is held on.

8. A circuit for implementing a charge/discharge switch in an integrated circuit, the circuit comprising:

a capacitor;

a charging circuit comprising:

a supply bias path coupled to a first node, wherein the supply bias path provides a charging bias current to the first node;

a charge transistor connected between the first node and a first terminal of the capacitor; and a charge switch coupled between the first node and a ground potential, wherein the charge switch enables charging the capacitor by way of the first node; and a discharging circuit comprising:

a discharge transistor connected between the first terminal of the capacitor and a second node;

a discharge switch coupled between the second node and a reference voltage, wherein the discharge switch enables discharging of the capacitor by way of the second node; and a ground bias path coupled between the second node and ground, wherein the ground bias path provides a discharging bias current to the second node;

wherein the charging circuit and the discharging circuit enable implementing the circuit in a charge mode and a discharge mode, and a discharge path through a transistor is turned on before a charge path through the charge transistor is turned off to enable the discharge mode.

9. The circuit of claim 8 wherein the charge switch is provided in a current path that is separate from the charge path enabling the charging of the capacitor.

10. The circuit of claim 8 wherein the charge switch comprises a first transistor that is coupled to receive a charge signal and a second transistor that is coupled in series with the first transistor and held on, the charge signal disabling a path from the first node to ground to enable the charging of the capacitor.

11. The circuit of claim 8 wherein the discharge switch is provided in a current path that is separate from the discharge path enabling the discharging of the capacitor.

12. The circuit of claim 8 wherein the discharge switch comprises a first transistor that is coupled to receive a discharge signal and a second transistor that is coupled in series with the first transistor and held on, the discharge signal disabling a path from the second node to a supply voltage to enable the discharging of the capacitor.

13. The circuit of claim 8 wherein the capacitor is implemented in a capacitor-based circuit from a group consisting of a PLL circuit, a relaxation oscillator circuit and a DAC circuit.

14. A method of implementing a charge/discharge switch in an integrated circuit, the method comprising:
  providing a charging path for charging a capacitor;
  providing a charge switch, separate from the charging path, to enable charging the capacitor by way of the charging path;
  providing a discharging path for discharging the capacitor; and
  providing a discharge switch, separate from the discharging path, to enable discharging the capacitor by way of the discharging path.

15. The method of claim 14 wherein providing a charging switch comprises providing a current path during a discharging mode that is separate from the charging path enabling the charging of the capacitor during a charging node.

16. The method of claim 14 further comprising coupling a charge signal to a first transistor of the charge switch coupled in series with a second transistor, that is held on, the charge signal disabling a path from the charging path to ground to enable the capacitor to charge by way of the charging path.

17. The method of claim 14 wherein providing a discharge switch comprises providing a current path, by way of the discharge switch, that is separate from the discharging path enabling the discharging of the capacitor.

18. The method of claim 14 further comprising coupling a discharge signal to a first transistor of the discharge switch coupled in series with a second transistor that is held on, the discharge signal disabling a path from the discharging path to a reference voltage to enable the capacitor to discharge by way of the discharging path.

19. The method of claim 14 further comprising coupling a charge signal to the charge switch and coupling a discharge signal to the discharge switch, wherein discharge signal enables the discharge switch to turn on before the charge signal enables the charge switch to turn off.

20. The method of claim 14 further comprising providing an overlap between a charge mode of operation and a discharge mode of operation, wherein the discharging path by way of a discharge transistor is turned on before the charging path by way of a charge transistor is turned off.

* * * * *